United States Patent
Meagley et al.

(10) Patent No.: US 6,833,320 B2
(45) Date of Patent: Dec. 21, 2004

(54) REMOVING SACRIFICIAL MATERIAL BY THERMAL DECOMPOSITION

(75) Inventors: Robert P. Meagley, Hillsboro, OR (US); Peter K. Moon, Portland, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/287,369

(22) Filed: Nov. 4, 2002

(65) Prior Publication Data

US 2004/0087060 A1 May 6, 2004

(51) Int. Cl.⁷ .......................................... H01L 21/4763
(52) U.S. Cl. ...................................... 438/640; 438/781
(58) Field of Search ................................ 438/640, 781, 438/782, 637, 289, 682, 197

(56) References Cited

U.S. PATENT DOCUMENTS 6,093,636 A * 7/2000 Carter et al. ................. 438/781
2003/0186535 A1 * 10/2003 Wong et al. ................. 438/637

OTHER PUBLICATIONS

White et al., "Synthesis and Characterization of Photodefinable Polycarbonates for Use as Sacrificial Materials inthe Fagrication of Microfluidic Devices", Journal, Proceedings of the SPIE, vol. 4690, pp. 242–253, Mar. 2002.*

* cited by examiner

Primary Examiner—Chandra Chaudhari
(74) Attorney, Agent, or Firm—Trop, Pruner & Hu, P.C.

(57) ABSTRACT

A thermally decomposable sacrificial material is deposited in a void or opening in a dielectric layer on a semiconductor substrate. The thermally decomposable sacrificial material may be removed without damaging or removing the dielectric layer. The thermally decomposable sacrificial material may be a combination of organic and inorganic materials, such as a hydrocarbon-siloxane polymer hybrid.

15 Claims, 5 Drawing Sheets

REMOVING SACRIFICIAL MATERIAL BY THERMAL DECOMPOSITION

BACKGROUND

The present invention relates generally to the field of integrated circuit manufacturing, and more specifically, to depositing and removing sacrificial material from voids or openings in a dielectric layer on a semiconductor substrate.

Sacrificial material has been used in integrated circuit manufacturing to fill voids or openings in a dielectric layer on a semiconductor substrate. Sacrificial material generally has been a spin-on-polymer (SOP) or spin-on-glass (SOG) that is deposited by spin coating to completely fill openings in the dielectric layer. For example, sacrificial material has been used in processes for providing dual damascene metal interconnects in integrated circuits.

The dual damascene concept involves forming both a via and a trench in the dielectric layer or interlayer dielectric (ILD). For example, the via may be etched first. After sacrificial material is deposited to fill the via and leave between about 500 and 3,000 angstroms of the material on the surface of the device, the trench is etched. The use of sacrificial material allows the trench lithography and etching process to effectively apply to a substantially hole-free surface, similar to a surface without vias. Sacrificial material may be selected so that when the trench is etched, the sacrificial material may be removed at a faster rate than the dielectric layer.

After etching the trench, any remaining sacrificial material may be cleaned out and removed from the via by a combination of plasma processing and wet chemistry steps. Depending on the type of sacrificial material used, various wet etch chemistries may be used to remove the remaining sacrificial material, including buffered oxide etch processes or chemistry based on commercially available amine based materials. After the remaining sacrificial material is removed, the via and trench may be filled with a conductive material such as copper to form a complete conductive layer of interconnects. Chemical metal polishing (CMP) then may be performed to remove excess material and planarize the surface.

Although the various chemical etch steps for dissolution of the sacrificial material may have high selectivity for sacrificial material over dielectric material, they nevertheless can damage or remove dielectric materials used for the ILD. Dielectric materials with lower dielectric constants (K) are needed to reduce capacitive coupling and cross talk between adjacent metal lines in dual damascene structures. However, as the ILD dielectric constant is reduced, ILD resistance to damage during cleaning and removal of sacrificial material also is reduced. Thus, for dual damascene interconnects to realize their full potential, especially in sub 0.25 micron process technology, the problem of damage to the dielectric layer during removal and cleaning of sacrificial material must be addressed.

Thus, there is a need for sacrificial material that can be used to fill voids or openings in a dielectric layer and can be removed or cleaned out without also damaging or removing the dielectric. There is a need to reduce defects and improve yield by enabling a more efficient and effective cleaning procedure to remove sacrificial material in ILD materials and especially ILD materials with low dielectric constants. There is a need for dual damascene process that enables use of ILD materials having lower dielectric constants.

DETAILED DESCRIPTION

Set forth below is a description of several embodiments of the present invention, presented in the context of a semiconductor device that includes a copper containing dual damascene interconnect. The description is made with reference to FIGS. 1a–1d and FIGS. 2a–2d which illustrate cross-sections of structures that result after using certain steps according to certain embodiments of the invention, and FIGS. 3 and 4 which are flow diagrams of processes according to embodiments of the invention. Although a dual damascene interconnect is described, it will be understood that the present invention also may be used in the context of other semiconductor devices, including but not limited to single damascene processes, in which sacrificial material may be used to fill voids or openings in a dielectric layer.

Figure 1A:
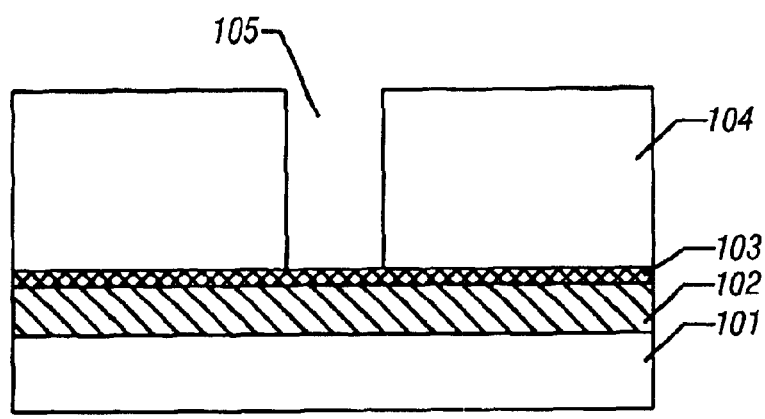
FIGS. 1a–1d illustrate cross-sections that reflect structures that may result after certain steps are used to make a copper containing dual damascene device following one embodiment of the present invention.

FIG. 1a shows substrate 101 with first conductive layer 102, barrier layer 103, and dielectric layer or ILD 104. The substrate may be any surface, generated when making an integrated circuit, upon which a conductive layer may be formed. The substrate thus may include, for example, active and passive devices that are formed on a silicon wafer such as transistors, capacitors, resistors, diffused junctions, gate electrodes, local interconnects, etc. The substrate also may include insulating materials (e.g., silicon dioxide, either undoped or doped with phosphorus (PSG) or boron and phosphorus (BPSG); silicon nitride; silicon oxynitride; or a polymer) that separate such active and passive devices from the conductive layer or layers that are formed on top of them, and may include previously formed conductive layers.

The first conductive layer preferably comprises copper, and may be formed using a conventional copper electroplating process, in which a copper layer is formed on barrier and seed layers. The first conductive layer also may be made from other materials conventionally used to form conductive layers for integrated circuits. For example, the first conductive layer may be made from a copper alloy, aluminum or an aluminum alloy, such as an aluminum/copper alloy. Alternatively, the first conductive layer may be made from doped polysilicon or a silicide, e.g., a silicide comprising tungsten, titanium, nickel or cobalt. The first conductive layer may include a number of separate layers. For example, the first conductive layer may comprise a primary conductor made from an aluminum/copper alloy that is sandwiched between a relatively thin titanium layer located below it and a titanium, titanium nitride double layer above it. The first conductive layer may be formed by a chemical vapor or physical deposition process, like those that are well known to those skilled in the art. If copper is used to make the first conductive layer, a conventional copper electroplating process may be used. Although a few examples of the types of materials that may form the first conductive layer have been identified here, it may be formed from various other materials that can serve to conduct electricity within an integrated circuit. Although copper is preferred, the use of any other conducting material, which may be used to make an integrated circuit, falls within the spirit and scope of the present invention.

The barrier layer may be made from silicon nitride, but also may be made from other materials such as silicon oxynitride or silicon carbide, as is well known to those skilled in the art. When formed from silicon nitride, a chemical vapor deposition process may be used to form the barrier layer. The barrier layer may serve to prevent an unacceptable amount of copper, or other metal, from diffusing into other layers, and also may act as an etch stop to prevent subsequent via and trench etch steps from exposing the first conductive layer to subsequent cleaning steps. The barrier layer should be thick enough to perform its diffusion inhibition and etch stop functions, but not so thick that it adversely impacts the overall dielectric characteristics resulting from the combination of the barrier layer and the dielectric layer overlying the barrier layer. The thickness of the barrier layer preferably should be less than about 10% of the thickness of the overlying dielectric layer, and preferably between about 100 and 500 angstroms thick.

In one embodiment, the dielectric layer has a dielectric constant lower than 3.9 which is the dielectric constant of silicon dioxide. For example, the dielectric layer may comprise plasma enhanced chemical vapor deposition (PECVD) silicon dioxide doped with carbon, having a dielectric constant of approximately 2.2 to 2.6. Other materials that may be used for the dielectric layer include materials that may insulate one conductive layer from another, and preferably those materials having dielectric constants below that of silicon dioxide, and most preferably materials with dielectric constants below 3.0. For example, the dielectric layer may comprise fluorinated silicon dioxide or organic polymers selected from the group that includes polyimides, parylenes, polyarylethers, polynaphthalenes, and polyquinolines, or copolymers thereof. The dielectric layer preferably has a thickness of between about 2,000 and about 20,000 angstroms.

In one embodiment of the invention, as shown in FIG. 1a, via 105 is etched into the dielectric layer. To etch the via, a photoresist layer may be patterned on top of the dielectric layer to define the via formation region, using conventional photolithographic techniques, such as masking a layer of photoresist, exposing the masked layer to light, then developing the unexposed portions. Alternatives to photoresist also may be used, including a bi- or multi-layer photolithographic process, imprinting, electron beam, x-ray atomic force microscopy (AFM), or other forms of advanced lithography. Conventional process steps for etching through a dielectric layer may be used to etch the via, e.g., a conventional anisotropic dry oxide etch process. For example, the via may be etched using a medium density magnetically enhanced reactive ion etching system (MERIE system) using fluorocarbon chemistry, or a forming gas chemistry, e.g., one including nitrogen and either hydrogen or oxygen.

Figure 1B:
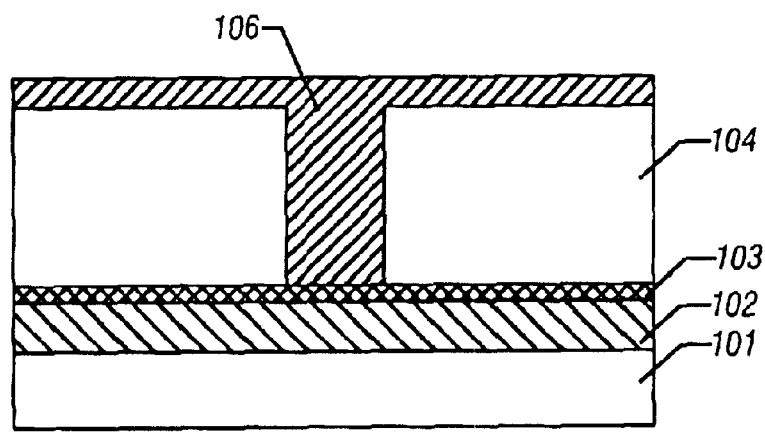

As shown in FIG. 1b, thermally decomposable sacrificial material is used to fill via 105. In one embodiment, the thermally decomposable sacrificial material may be deposited by spin coating between about 500 and about 3,000 angstroms of the material onto the surface of the device. The spin coating process causes the thermally decomposable sacrificial material to substantially or completely fill the via, with a thin layer of the material on the surface of the device.

In one embodiment, the thermally decomposable sacrificial material may be a combination of inorganic and organic materials, such as silicon-containing and carbonaceous materials. For example, the thermally decomposable sacrificial material may be a hydrocarbon-siloxane polymer hybrid. The siloxane oligomers may be either main chain or side chains (grafted) in the copolymers. These include, but are not limited to, silicon containing graft-copolymers such as polysiloxane with an oligopolyolefin, oligopolycyclolefin, oligopolyarylolefin, or oligopolycarbonate graft, and combinations thereof. Additionally, these include polyolefin, polycyclolefin, oligopolyarylolefin, or oligopolycarbonate, or combinations thereof, with an oligosiloxane graft.

The following chart lists examples of other thermally decomposable hydrocarbon containing oligomers and polymers that may be used to form graft-copolymers, along with their thermal decomposition temperatures (Td) in degrees Centigrade.

| Polymer Basis or Family | Td |
| --- | --- |
| Polypropylene oxide | 325 to 375 C |
| Polymethlystyrene | 350 to 375 C |
| Polycaprolactone | 325 C |
| Polycarbonate | 325 to 375 C |
| Polyamideimide | 343 C |
| Polyamide-6,6 | 302 C |
| Polyphthalamide | 350 C |
| Polyetherketone | 405 C |
| Polyethretherketone | 399 C |
| Polybutyllene terephthalate | 260 C |
| Polyethyllne terephthalate | 300 C |
| Polystyrene | 260 C |
| Polystyrene-syndiotactic | >320 C |
| Polyphenylene Sulfide | 332 C |
| Polyether Sulfone | 400 C |

Other examples of thermally decomposable sacrificial material, according to various embodiments of the invention, include polynorbornene with pendant siloxane moieties, marketed under the name UNITY, and/or related polyolefins, and polycarbonate, polyether, and poly (alphamethyl)styrene based compounds that undergo smooth thermal decomposition. Other examples of inorganic polymers and oligomers that may be used as thermally decomposable sacrificial material include hydrosilsesquioxanes, silsesquioxanes and carboranes. Thus, the thermally decomposable sacrificial material includes polymers that may be thermally decomposed, and may contain both organic and inorganic moieties, as well as differing levels of organic and inorganic species.

In one embodiment, the thermally decomposable sacrificial material may include polymer blends such as a siloxane polymer and cycololefin type polymer. If the blending of polymers results in a multiphase mixture, the size of the phase domains may be controlled and/or uniformly distributed.

In one embodiment, the thermally decomposable sacrificial material may include or be associated with a light absorbing material or dye. By dyeing the sacrificial material, changes in substrate reflectivity may be reduced, which may enable the photolithographic process to produce improved results. In one embodiment, for example, the dye may be associated to the copolymer through the hydrocarbon polymer portion of the hybrid components. Alternatively, the dye may be bonded to the siloxane component or admixture.

Figure 1C:
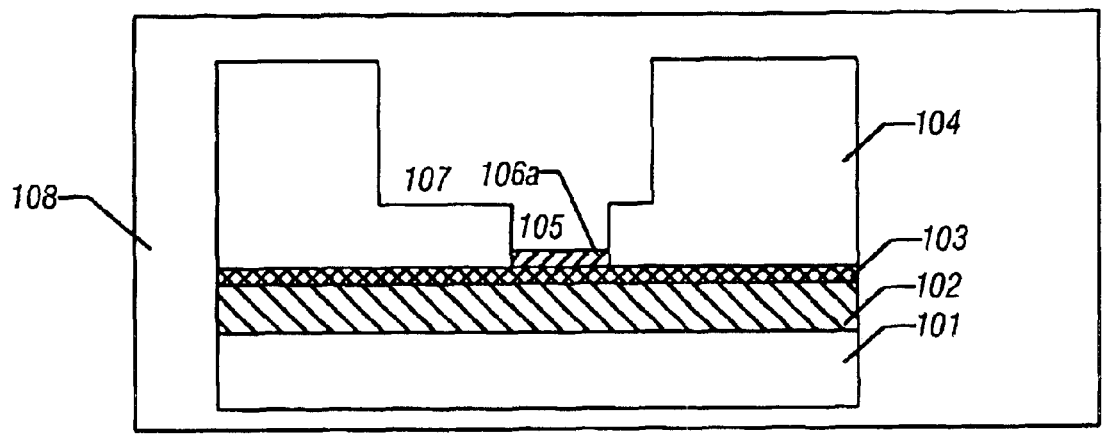

In one embodiment, as shown in FIG. 1c, trench 107 may be formed in the dielectric layer by lithographic and dry etch process steps. The etching process is applied for a time sufficient to form an opening in the dielectric layer and at least partially into the thermally decomposable sacrificial material to a desired depth. The trench etching process may remove some of the sacrificial material from the via.

In one embodiment, thermally decomposable sacrificial material 106a remaining in the via may be removed by thermal decomposition. This may be accomplished by heating the structure, preferably to a temperature no greater than 450 degrees C., and preferably in a reducing atmosphere. The thermal decomposition may occur in furnace 108. The thermally decomposable sacrificial material may be removed by thermal decomposition without damaging or removing the dielectric material.

The thermal decomposition reaction to remove the remaining thermally decomposable sacrificial material may also create a solubility difference between the pre-decomposition material and any post-decomposition residue, or enhanced solubility in the post-decomposition residue by virtue of mass loss and/or surface area increase. In addition to being removable by thermal decomposition, the sacrificial material is thermally stable at the temperatures that are typically used for lithography, reactive ion etch (RIE) and resist removal in wet chemistries. These temperatures are typically less than 150 degrees C.

Figure 1D:
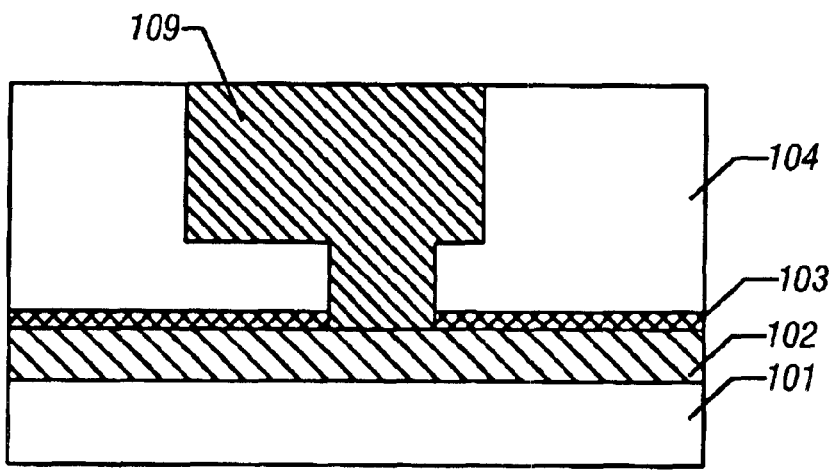

In one embodiment, as shown in FIG. 1d, the trench and via are filled with second conductive layer 109. A portion of the barrier layer that separates the via from the first conductive layer may be removed to expose the first conductive layer. A CMP step may be used to remove excess conductive material and planarize the surface of the second conductive layer. Although FIG. 1d shows only one dielectric layer and two conductive layers, the process described above may be repeated to form additional conductive and insulating layers until the desired integrated circuit is produced.

Figure 2A:
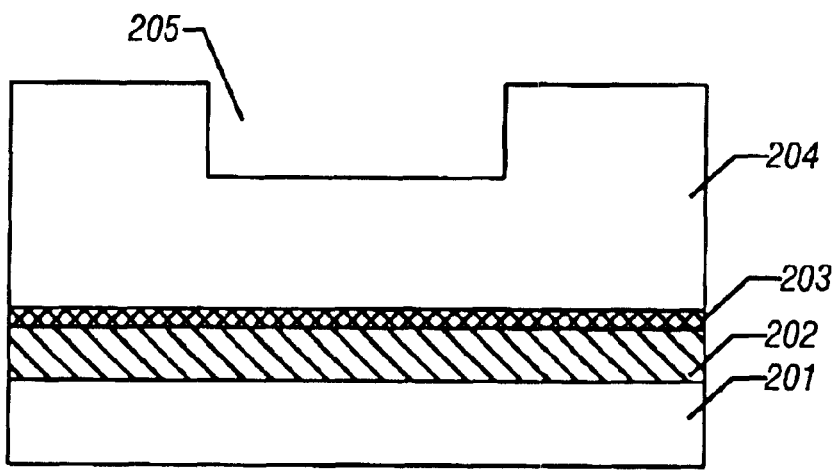
FIGS. 2a–2d illustrate cross-sections that reflect structures that may result after certain steps are used to make a copper containing dual damascene device following a second embodiment of the present invention.
Figure 2B:
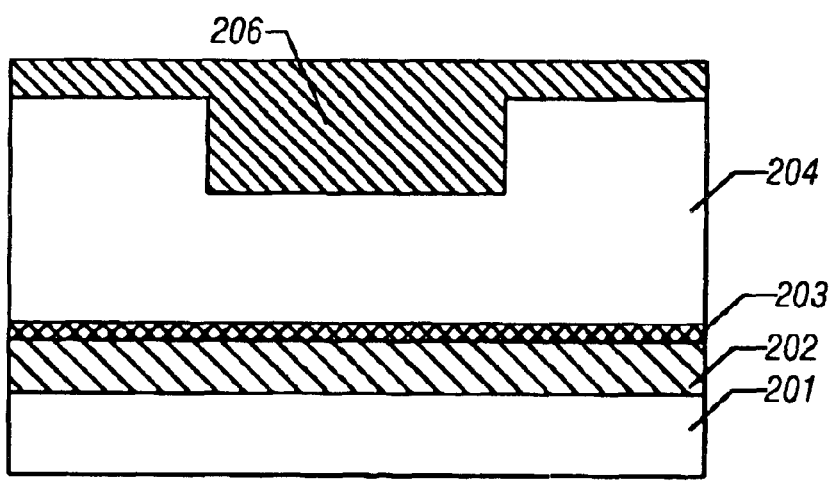

FIGS. 2a–2d represent structures that may be formed when applying a second embodiment of the present invention. FIG. 2a shows a structure similar to the one shown in FIG. 1a, including substrate 201, first conductive layer 202, barrier layer 203, and dielectric layer 204, except that trench 205 is formed in the dielectric layer. As shown in FIG. 2b, thermally decomposable sacrificial material 206 may be applied to the device, e.g., by spin coating it onto the device's surface, to fill the trench and also create a substantially planar surface over the device.

Figure 2C:
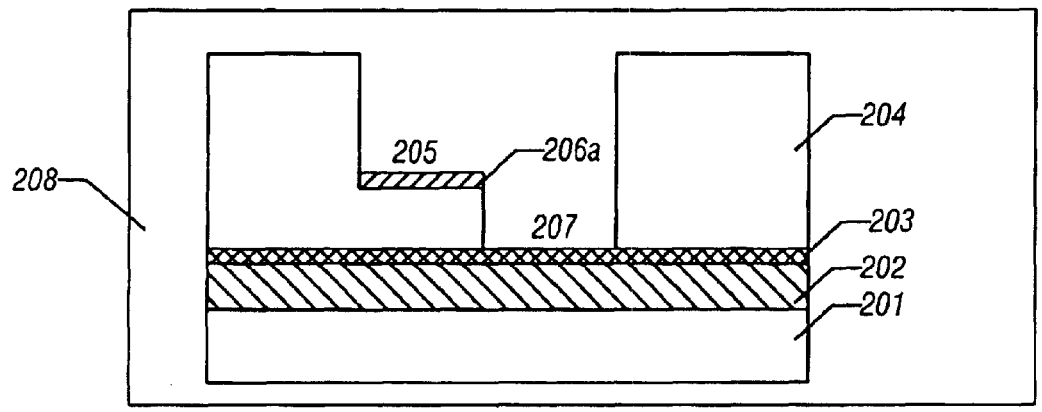
Figure 2D:
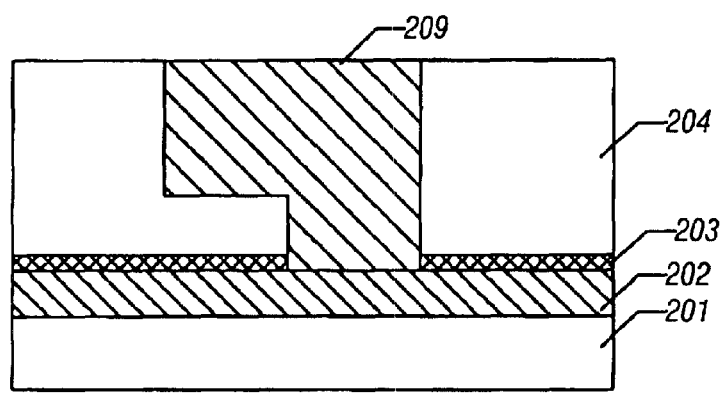

As shown in FIG. 2c, via 207 is then patterned and etched through the exposed portion of the thermally decomposable sacrificial material and through the underlying portion of the dielectric layer. Remaining thermally decomposable sacrificial material 206a is removed from the trench by thermal decomposition, i.e., in furnace 208. In FIG. 2d, second conductive layer 209 is applied to fill the via and trench, which then may be planarized.

Figure 3:
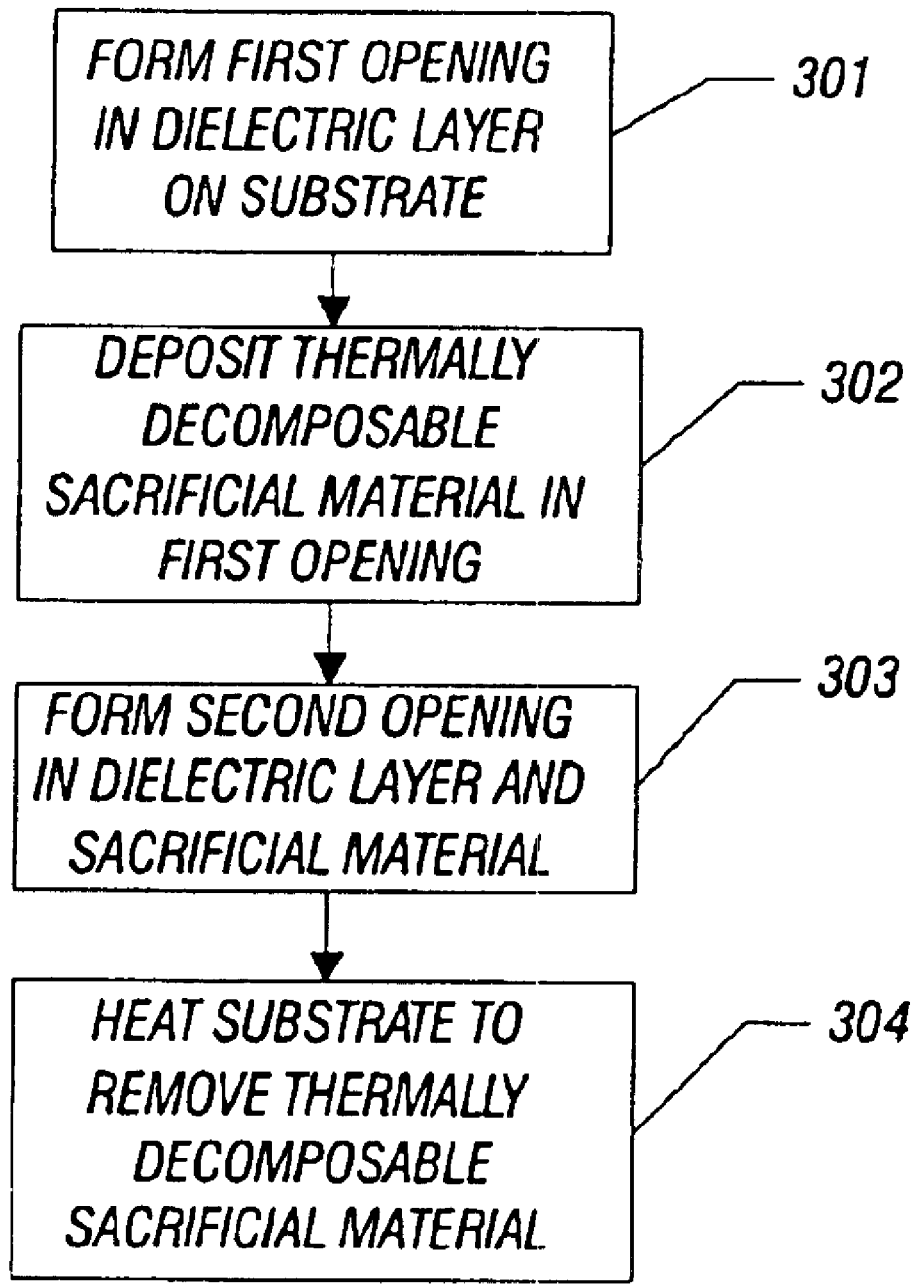
FIG. 3 illustrates a block diagram of a process according to one embodiment of the present invention.

FIG. 3 illustrates a flow diagram of a process which may be performed according to one embodiment of the invention. In block 301, a first opening is formed in a dielectric layer on a substrate. In block 302, thermally decomposable sacrificial material is deposited in the first opening. In block 303, a second opening is formed in the dielectric layer and at least partially in the thermally decomposable sacrificial material. In block 304, the substrate is heated to a temperature sufficient to remove additional thermally decomposable sacrificial material that remains in the first opening.

Figure 4:
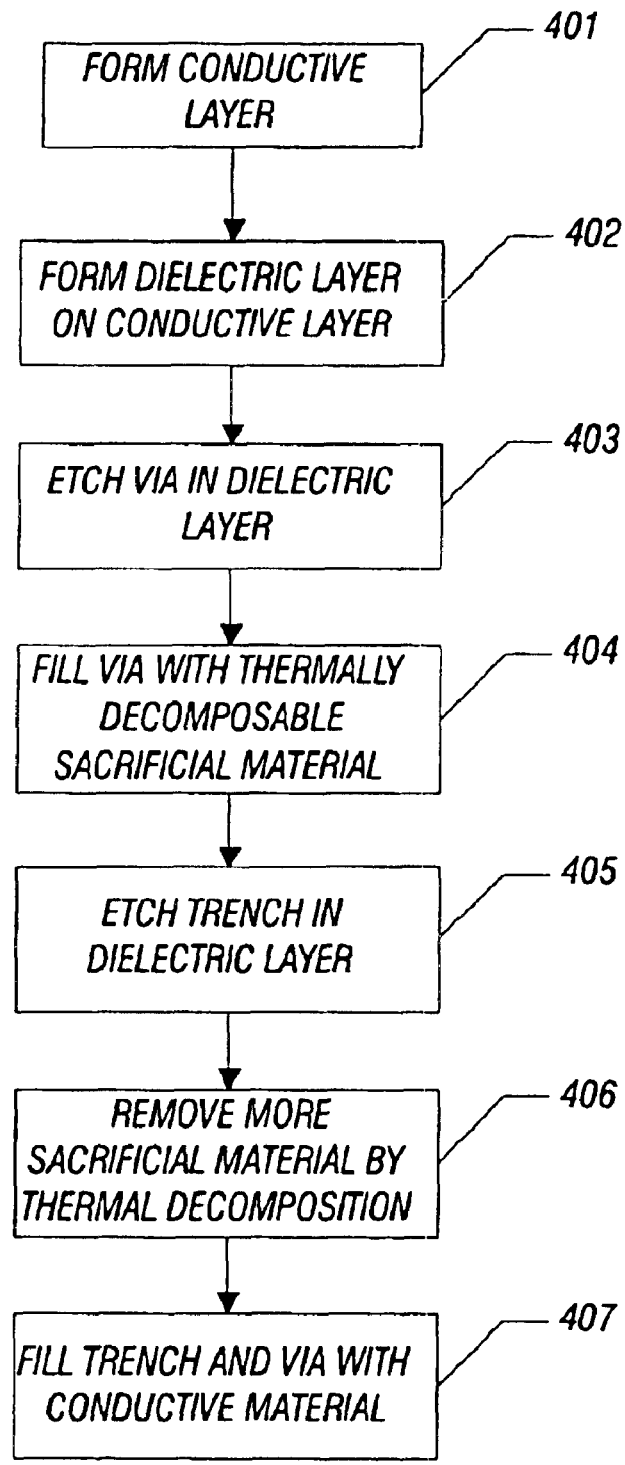
FIG. 4 illustrates a block diagram of a process according to another embodiment of the present invention.

FIG. 4 is a block diagram illustrating another embodiment of the invention. In block 401, a conductive layer is formed on a substrate. In block 402, a dielectric layer or ILD is formed over the conductive layer. The dielectric layer is preferably material having a dielectric constant below that of silicon dioxide.

In block 403, a via is etched into the dielectric layer. To etch the via, a photoresist layer may be patterned on top of the dielectric layer using conventional photolithographic techniques, such as masking the layer of photoresist, exposing the masked layer to light, then developing the unexposed portions. The via then may be etched through the dielectric layer using a conventional anisotropic dry oxide etch process. For example, the via may be etched using a medium density magnetically enhanced reactive ion etching system (MERIE system) using fluorocarbon chemistry, or a forming gas chemistry, e.g., one including nitrogen and either hydrogen or oxygen.

In block 404, the via is filled with thermally decomposable sacrificial material. The thermally decomposable sacrificial material is material that may be thermally decomposed and evaporated at an acceptable temperature, preferably less than 450 degrees C., in a reducing atmosphere, so that it can be removed without damaging dielectric material with a low dielectric constant. The thermally decomposable sacrificial material may be deposited by spin coating between about 500 and about 3,000 angstroms of the material onto the surface of the device. The spin coating process causes the thermally decomposable sacrificial material to substantially or completely fill the via, with a thin layer coating the surface of the device.

In block 405, a trench is etched in the dielectric layer using photolithographic and etching steps. In block 406, remaining or additional sacrificial material may be removed by thermal decomposition in an oven or furnace. Residue of the sacrificial material also may be chemically cleaned, if necessary. In block 407, the trench and via may be filled with conductive material to form a second conductive layer, and the surface planarized. The portion of the barrier layer at the bottom of the via also may be removed to expose the first conductive layer to the second conductive layer.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a first opening in a dielectric layer on a semiconductor substrate;
    depositing a thermally decomposable sacrificial material in the first opening;
    forming a second opening in the dielectric layer and at least partially in the thermally decomposable sacrificial material; and
    heating the semiconductor substrate to remove thermally decomposable sacrificial material from the first opening.

2. The method of claim 1 further comprising filling the first and second openings with conductive material.

3. The method of claim 1 further comprising chemically cleaning any remaining thermally decomposable sacrificial material from the first opening after heating the semiconductor substrate to remove thermally decomposable sacrificial material from the first opening.

4. The method of claim 1 wherein the thermally decomposable sacrificial material is a hydrocarbon-siloxane polymer hybrid.

5. The method of claim 1 wherein forming the first opening comprises patterning and etching a via.

6. The method of claim 1 wherein forming the first opening comprises patterning and etching a trench.

7. The method of claim 1 wherein depositing the thermally decomposable sacrificial material comprises spin coating the thermally decomposable sacrificial material to completely fill the first opening.

8. The method of claim 1 wherein forming the second opening comprises dry etching the thermally decomposable sacrificial material at a faster rate than the dielectric layer.

9. The method of claim 1 wherein heating the semiconductor substrate is at a maximum temperature of 450 degrees C.

10. A method comprising:
forming a conductive layer on a substrate;
forming a dielectric layer on the conductive layer;
etching a via by removing a first portion of the dielectric layer;
filling the via with a thermally decomposable sacrificial material;
etching a trench by removing a second portion of the dielectric layer and at least some of the thermally decomposable sacrificial material;
removing some more of the thermally decomposable sacrificial material by thermal decomposition; and
filling the trench and via with conductive material.

11. The method of claim 10 wherein the via and the trench comprise a dual damascene interconnect.

12. The method of claim 10 wherein etching the via comprises patterning a masking layer on top of the dielectric layer and dry etching into the dielectric layer.

13. The method of claim 10 wherein removing some more of the thermally decomposable sacrificial material comprises heating to a maximum temperature of 450 degrees C.

14. The method of claim 10 wherein filling the via with a thermally decomposable sacrificial material comprises spin coating the thermally decomposable sacrificial material to fill the via, with between 500 and 3,000 Angstroms of the material on the surface.

15. The method of claim 10 wherein the thermally decomposable sacrificial material comprises a combination of silicon-containing and carbonaceous materials.

* * * * *